(12) United States Patent
Marshall et al.

(10) Patent No.: US 12,553,998 B2
(45) Date of Patent: Feb. 17, 2026

(54) ULTRA-WIDEBAND PULSE AND ULTRA-WIDEBAND PULSE-BASED RANGING

(71) Applicant: Stichting IMEC Nederland, Eindhoven (NL)

(72) Inventors: Chris Marshall, Waalre (NL); Erwin Allebes, Sterksel (NL); Minyoung Song, Eindhoven (NL); Elbert Betchthum, Veldhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 251 days.

(21) Appl. No.: 18/538,623

(22) Filed: Dec. 13, 2023

(65) Prior Publication Data
US 2024/0201355 A1  Jun. 20, 2024

(30) Foreign Application Priority Data
Dec. 14, 2022 (EP) .................................... 22213303

(51) Int. Cl.
G01S 11/08 (2006.01)
(52) U.S. Cl.
CPC .................................... G01S 11/08 (2013.01)
(58) Field of Classification Search
CPC ...................................................... G01S 11/08
USPC ...................................................... 342/458
See application file for complete search history.

(56) References Cited

U.S. PATENT DOCUMENTS

| | | | |
|---|---|---|---|
| 7,145,961 B2 | 12/2006 | Carbonari | |
| 9,054,789 B2 | 6/2015 | Bourdel et al. | |
| 9,413,418 B2 * | 8/2016 | Bottazzi | H04B 1/707 |
| 12,040,826 B2 * | 7/2024 | Nabki | H04B 1/69 |
| 2006/0039449 A1 | 2/2006 | Fontana et al. | |

FOREIGN PATENT DOCUMENTS

| | | | | |
|---|---|---|---|---|
| CN | 119291670 A | * | 1/2025 | H04W 4/80 |
| EP | 4142228 A1 | * | 3/2023 | H04B 1/04 |
| JP | 7145961 B2 | * | 10/2022 | H04W 36/0088 |

OTHER PUBLICATIONS

Extended European Search Report and Search Opinion, Application No. EP 22213303.5, mailed Jun. 2, 2023, 9 pages.
Hernández, Angela, Rubén Badorrey, Juan Chóliz, Ignacio Alastruey, and Antonio Valdovinos. "Accurate indoor wireless location with IR UWB systems a performance evaluation of joint receiver structures and TOA based mechanism." IEEE Transactions on Consumer Electronics 54, No. 2 (2008): 381-389.

(Continued)

Primary Examiner — Harry K Liu
(74) Attorney, Agent, or Firm — McDonnell Boehnen Hulbert & Berghoff LLP

(57) ABSTRACT

A method for generating an ultra-wideband signal is provided. The method comprises the steps of generating at least one ultra-wideband pulse envelope comprising a main pulse and a precursor pulse, the precursor pulse being shorter in length and lower in amplitude compared to the main pulse, and modulating a carrier signal in amplitude such that the envelope corresponds to the at least one ultra-wideband pulse envelope and such that the carrier signal within the main pulse is phase-shifted with respect to the carrier signal within the precursor pulse.

20 Claims, 12 Drawing Sheets

(56) References Cited

OTHER PUBLICATIONS

Han, Su, Bowen Wang, Woogeun Rhee, and Zhihua Wang. "An 8GHz Communication/Ranging IR-UWB Transmitter with Asymmetric Pulse Shaping and Frequency Hopping for Fine Ranging and Enhanced Link Margin." In 2022 IEEE International Symposium on Circuits and Systems (ISCAS), pp. 757-760. IEEE, 2022.
Singh, Gaurav, Erwin Allebes, Yuming He, Evgenii Tiurin, Paul Mateman, Johan F. Dijkhuis, Gert-Jan van Schaik et al. "An IR-UWB IEEE 802.15. 4z compatible coherent asynchronous polar transmitter in 28-nm CMOS." IEEE Journal of Solid-State Circuits 56, No. 12 (2021): 3799-3810.
Domuta, Ioan, Tudor Petru Palade, Emanuel Puschita, and Andra Pastrav. "Timestamp estimation in P802. 15.4 z amendment." Sensors 20, No. 18 (2020): 5422.
Pflug, Hans W. "Uwb pulse shaping for IEEE 802.15. 4a." In 2008 38th European Microwave Conference, pp. 713-716. IEEE, 2008.
Wei, Y. Y. "Design a simple, low-cost UWB source." (2006): 68-74.
Xia, Jingjing, Choi Look Law, and Yuan Zhou. "Synthesis, design and implementation of ultra-wideband impulse radio active MMIC matched filters." Progress In Electromagnetics Research C 28 (2012): 239-255.
Ašmontas, S., F. Anisimovas, L. Dapkus, J. Gradauskas, O. Kiprijanovič, I. Prosyčevas, J. Puio, K. lapikas, and B. Vengalis. "Radiation of ultra-wideband electromagnetic pulses by pulsed excitation of rectangular antenna." Lithuanian Journal of Physics 49, No. 1 (2009): 29-34.

Yan, Wenhe, Ming Dong, Shifeng Li, Chaozhong Yang, Jiangbin Yuan, Zhaopeng Hu, and Yu Hua. "An eLoran signal cycle identification method based on joint time-frequency domain." Remote Sensing 14, No. 2 (2022): 250.
Awarkeh, Nour, J-C. Cousin, Muriel Muller, and Nel Samama. "Improvement of the angle of arrival measurement accuracy for indoor UWB localization." Journal of Sensors 2020 (2020): 1-8.
Zhou, Kai, Chunlin Huang, Yi Su, and Min Lu. "Ultra-wideband pulse generator with picosecond fall time and tunable amplitude." In 2017 9th International Workshop on Advanced Ground Penetrating Radar (IWAGPR), pp. 1-5. IEEE, 2017.
Négrier, Romain, Michèle Lalande, Valérie Bertrand, Joël Andrieu, Vincent Couderc, Badr M. Shalaby, Laurent Pecastaing, Antoine De Ferron, and Laurent Desrumaux. "UWB impulse radiation source with integrated optoelectronic generator." International Journal of Microwave and Wireless Technologies 8, No. 4-5 (2016): 795-805.
Kuhn, Michael J., Mohamed R. Mahfouz, Cemin Zhang, Brandon C. Merkl, and Aly E. Fathy. "A system-level simulation framework for UWB localization." IEEE transactions on microwave theory and techniques 58, No. 12 (2010): 3527-3537.
Phan, Tuan-Anh, Vladimir Krizhanovskii, Seok-Kyun Han, Sang-Gug Lee, Hyun-seo Oh, and Nae-Soo Kim. "4.7 pJ/pulse 7 th derivative Gaussian pulse generator for Impulse Radio UWB." In 2007 IEEE International Symposium on Circuits and Systems, pp. 3043-3046. IEEE, 2007.

\* cited by examiner

ULTRA-WIDEBAND PULSE AND ULTRA-WIDEBAND PULSE-BASED RANGING

CROSS-REFERENCE TO RELATED APPLICATIONS

The present application is a non-provisional patent application claiming priority to European Patent Application No. EP 22213303.5, filed Dec. 14, 2022, the contents of which are hereby incorporated by reference.

FIELD OF THE DISCLOSURE

The present disclosure relates to ultra-wideband signal generation and ultra-wideband signal-based ranging and/or sensing, especially for ultra-wideband positioning and/or sensing systems.

BACKGROUND

Generally, the ultra-wideband pulses comprise a short pulse duration that may facilitate a receiver to measure the line of sight or the direct path signal before the multipath component signal arrives, e.g., a few nanoseconds later. For example, the document US 2006/0039449 A1 discloses an ultra-wideband pulse generation scheme for communications, object detection and radar applications.

As such, the precision of the measurement of time of arrival may depend on the shape of the amplitude envelope, i.e., a shorter pulse with a steeper rise time and fall time may facilitate better measurement. However, if the path length of the multipath components is short, it is still possible that said components may interfere with the measurement of the direct path. This can be further mitigated by measuring the time at the receiver at which the rising edge of the amplitude envelope crosses a predefined threshold.

Therefore, especially in a multipath environment when the use of the trailing edge as well as peak of the received pulse are unreliable, the precision of the measurement of the time of arrival by the receiver may be substantially determined by the slope of the leading edge of its amplitude envelope. In other words, the steeper the slope of the rate of change of the amplitude with time, the smaller the time error that may be produced by the noise. This may affect the measurement of the instantaneous amplitude.

However, even for a direct path signal with a steeper leading edge of the envelope, the receiver filter may alter the shape of the direct path signal as well as the shape of the multipath signal, especially after signal reception and filtering, thereby tending to slow the leading edge and to sharpen the trailing edge of the envelope.

SUMMARY

The present disclosure provides an ultra-wideband signal generation scheme that may improve the precision of the measurement of the time of arrival. The present disclosure may further provide an ultra-wideband signal-based ranging and/or sensing scheme that is robust against multipath, and may further measure or sense the multipath components.

According to a first example of the present disclosure, a method for generating an ultra-wideband signal is provided. The method comprises the steps of generating at least one ultra-wideband pulse envelope comprising a main pulse and a precursor pulse, the precursor pulse being shorter in length and lower or smaller in amplitude compared to the main pulse, and modulating a carrier signal in amplitude such that the envelope corresponds to the at least one ultra-wideband pulse envelope and such that the carrier signal within the main pulse is phase-shifted with respect to the carrier signal within the precursor pulse.

It is to be noted that the term "phase-shifted" should be understood as a difference in phase relationship between the main pulse and the precursor pulse, especially the difference in phase relationship of the carrier signal corresponding to the main pulse and the precursor pulse. Accordingly, for example, the precursor pulse may be regarded as having a different negative phase in relation to the main pulse.

In some examples, the negative precursor pulse, for example when inserted before the main pulse of the ultra-wideband signal, may add downwards energy to the main pulse, thereby resulting the leading edge or rising edge of the main pulse steeper as the leading edge is already rising at the zero crossing. The term "downward energy" can be understood from the effect of having signal energy for the precursor pulse out of phase with that of the main pulse, which may destructively interfere with the beginning of the main pulse, e.g., in the receiver filter, thereby resulting in the steeper rise time of the main pulse. This may improve the accuracy of the measurement, in particular to improve the ranging performance, due to the steeper leading edge of the main pulse even after filtering inside a receiver.

In some examples, the main pulse is an asymmetrical pulse comprising a steeper slope for a leading edge of the main pulse compared to a trailing edge of the main pulse. In some examples, the main pulse with a sharper amplitude envelope leading edge, in particular while meeting the spectrum requirements, may improve the measurement performance in the presence of multipath. For example, due to the steeper slope and the reduced elapsed time of the peak, the multipath components may have less effect on the direct path measurement.

In some examples, the method further comprises the step of phase-shifting the carrier signal within the main pulse by a range of from 90° to 270°. In some examples the range may be from 150° to 210°. In some examples, the phase-shifting may be 180° with respect to the carrier signal within the precursor pulse. In some examples, the phase-shift between the main pulse and the precursor pulse may provide an additional early pulse element to the main pulse in order to add some downward energy to the main pulse envelope.

According to a second example of the present disclosure, an ultra-wideband transmitter is provided. The ultra-wideband transmitter comprises an envelope generator and a carrier signal generator. In this regard, the envelope generator is configured to generate at least one ultra-wideband pulse envelope comprising a main pulse and a precursor pulse, the precursor pulse being shorter in length and lower in amplitude compared to the main pulse.

Furthermore, the carrier signal generator is configured to modulate a carrier signal in amplitude such that the envelope corresponds to the at least one ultra-wideband pulse envelope and such that the carrier signal within the main pulse is phase-shifted with respect to the carrier signal within the precursor pulse.

In some examples, the envelope generator comprises a first pulse generation path, a second pulse generation path, and a pulse combiner. In this regard, the envelope generator is configured to generate a main pulse envelope along the first pulse generation path and a precursor pulse envelope along the second pulse generation path.

Furthermore, the pulse combiner is configured to combine the main pulse envelope and the precursor pulse envelope, thereby generating the at least one ultra-wideband pulse envelope. In some examples, the main pulse envelope and the precursor pulse envelope can be independently generated.

In some examples, the pulse combiner is further configured to factorize an amplitude and a length of the precursor pulse envelope with respect to an amplitude and a length of the main pulse envelope, especially prior to the combination. In some examples, the amount of downward energy to be added to the main pulse can be effectively determined.

In some examples, the first pulse generation path comprises a delay element configured to provide a predefined time-delay, preferably a delay of one chip period. In other words, the main pulse may be delayed by one chip period compared to the precursor pulse.

In some examples, each of the first pulse generation path and the second pulse generation path comprises a pulse shaping unit configured to generate a pulse envelope having an asymmetrical pulse shape, preferably comprising a steeper slope for a leading edge compared to a trailing edge of the pulse envelope. The pulse shaping unit may comprise one or more pulse shaping filters, e.g., a sinc shaped filter, a raised-cosine filter, a root-raised-cosine filter, a Gaussian filter, or a delay-based pulse shaping filter.

In some examples, the envelope generator is configured to receive unit pulses corresponding to a predefined amplitude code and a predefined phase code. For instance, the received unit pulses may correspond to a 2-bit ternary code comprising an amplitude code or bit and a phase code or bit.

In addition, the pulse shaping unit may comprise a first pulse shaping path and a second pulse shaping path, the first pulse shaping path and the second pulse shaping path being time-interleaved, preferably time-interleaved by one chip period, with respect to the unit pulses corresponding to the amplitude code, thereby generating time-interleaved pulse envelopes of the unit pulses corresponding to the amplitude code.

Moreover, the pulse shaping unit may comprise a further pulse combiner configured to combine the time-interleaved pulse envelopes of the unit pulses based on the unit pulses corresponding to the phase code.

In some examples, the generation of the consecutive pulses in the time-interleaved manner may eliminate the inter-symbol-interference (ISI) in the data stream, since the further pulse combiner may combine the time-interleaved pulses by taking into account the correct polarity (phase code) of the pulses.

In some examples, the carrier signal generator is further configured to phase-shift the carrier signal within the main pulse by a range of from 90° to 270°. In some example, the a range may be from 150° to 210°. In some examples, the phase-shift the carrier signal is 180° with respect to the carrier signal within the precursor pulse.

According to a third example of the present disclosure, an ultra-wideband ranging and/or sensing method is provided. The method comprises the steps of generating, by a transmitter, the ultra-wideband signal according to the first example of the present disclosure, transmitting the ultra-wideband signal by the transmitter, receiving the ultra-wideband signal by a receiver, and measuring a time of arrival at the slope of a leading edge of at least one direct path and/or multipath component of the ultra-wideband signal, especially of the main pulse, by the receiver.

In some examples, the method further comprises the step of measuring the time of arrival at the slope of the leading edge, for example, at an amplitude threshold level less than or equal to 70%. In some examples, the amplitude threshold may be less than or equal to 50% of a peak amplitude level of the ultra-wideband signal.

In some examples, by using the ultra-wideband signal that may result in the received signal (and the subsequent filtered signal) with a steeper leading edge and further by measuring the time of arrival at the slope of said leading edge, the measurement precision may be improved especially in a multipath environment. In addition, the measurement accuracy may also be improved in noise conditions without any multipath, especially due to the sharpening of the measured pulse, e.g., after filtering at the receiver, and an associated increase in the amplitude of its peak.

Furthermore, a threshold at around 50% of the direct path amplitude may correspond to the amplitude at which the rate of change of amplitude with time is steepest. However, defining a threshold below this level may not be advantageous since the receiver may be subjected to additional noise.

Moreover, the method may facilitate ranging operations, e.g., using the direct path component of the ultra-wideband signal and/or using the multipath components of the ultra-wideband signal, and may additionally facilitate sensing operations, e.g. for radar applications, to sense one or more multipath components of the ultra-wideband signal.

In some examples, the method further comprises the step of providing, by the transmitter, magnitude and/or phase information of the precursor pulse to the receiver. Additionally or alternatively, the method further comprises the step of providing, by the receiver, magnitude and/or phase information of the precursor pulse to the transmitter, and generating the precursor pulse based on the received magnitude and/or phase information by the transmitter. In some examples, the transmitter and the receiver may be able to configure each other, which may further improve the measurement performance.

According to a fourth example of the present disclosure, an ultra-wideband ranging and/or sensing system is provided. The system comprises a transmitter according to the second example of the present disclosure, the transmitter being configured to generate the ultra-wideband signal and further to transmit the ultra-wideband signal. The system further comprises a receiver configured to receive the ultra-wideband signal and further to measure a time of arrival at the slope of a leading edge of at least one direct path and/or multipath component of the ultra-wideband signal.

In this regard, the transmitter and the receiver may be arranged in a distributed manner within the system (e.g., a bi-static or multi-static configuration). Alternatively, the transmitter and the receiver may be collocated (e.g., a monostatic configuration), especially by forming a transceiver unit comprising the transmitter and the receiver.

In some examples, the receiver comprises a processing unit configured to measure the time of arrival at the slope of the leading edge, in some examples, at an amplitude threshold level less than or equal to 70%. In some example, the amplitude threshold level may be less than or equal to 50% of a peak amplitude level of the ultra-wideband signal.

In some examples, the transmitter is configured to provide magnitude and/or phase information of the precursor pulse to the receiver. Additionally or alternatively, the receiver is configured to provide magnitude and/or phase information of the precursor pulse to the transmitter, and the transmitter is further configured to generate the precursor pulse based on the received magnitude and/or phase information.

It is to be noted that the method according to the first example corresponds to the transmitter according to the second example and its implementation forms. Accordingly, the method according to the first example achieves the same advantages and effects as the transmitter of the second example and its respective implementation forms.

It is further to be noted that the method according to the third example corresponds to the system according to the fourth example and its implementation forms. Accordingly, the method according to the third example achieves the same advantages and effects as the system of the fourth example and its respective implementation forms.

BRIEF DESCRIPTION OF THE DRAWINGS

Embodiments of the present disclosure are now further explained with respect to the drawings by way of example only, and not for limitation. In the drawings.

DETAILED DESCRIPTION

Reference will now be made in detail to the embodiments of the present disclosure, examples of which are illustrated in the accompanying drawings. However, the following embodiments of the present disclosure may be variously modified and the range of the present disclosure is not limited by the following embodiments. Reference signs for similar entities in different embodiments are partially omitted.

Figure 1:
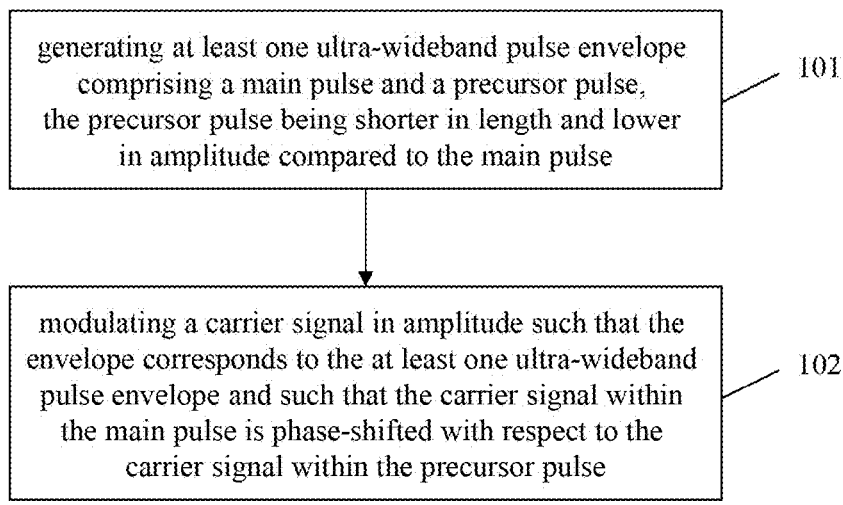
FIG. 1 shows an embodiment of the method according to an example of the present disclosure.

In FIG. 1, an embodiment of the method 100 according to the first example of the present disclosure is illustrated. In a first step 101, at least one ultra-wideband pulse envelope comprising a main pulse and a precursor pulse is generated, the precursor pulse being shorter in length and lower in amplitude compared to the main pulse. In a second step 102, a carrier signal is modulated in amplitude such that the envelope corresponds to the at least one ultra-wideband pulse envelope and such that the carrier signal within the main pulse is phase-shifted with respect to the carrier signal within the precursor pulse.

Figure 2A:
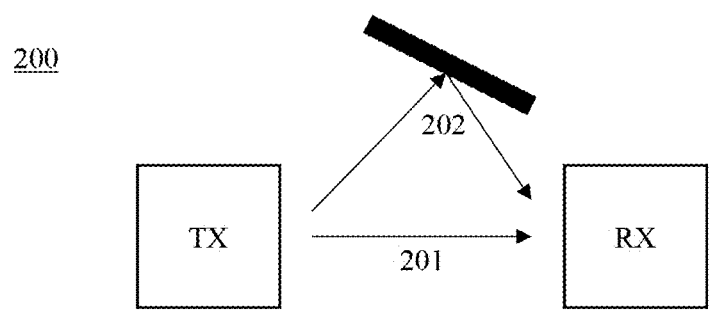
FIG. 2A shows a positioning system in a multipath environment.
Figure 2B:
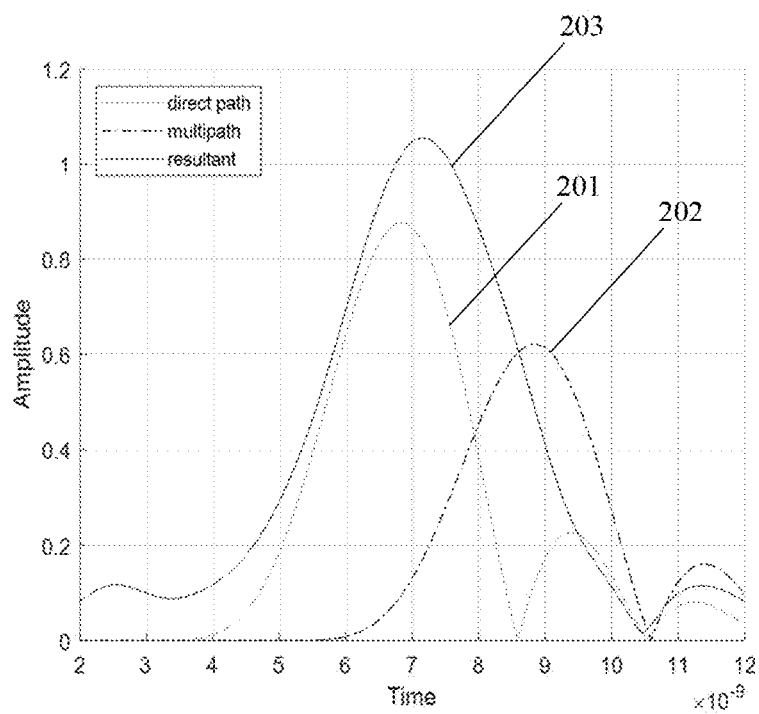
FIG. 2B shows a multipath effect with noise conditions on the positioning system of FIG. 2A.

In FIG. 2A and FIG. 2B, an ultra-wideband-based positioning scheme in a multipath environment is illustrated. Particularly, FIG. 2A shows an ultra-wideband-based positioning system comprising a transmitter TX and a receiver RX, the transmitter TX may transmit ultra-wideband pulses 201 and the receiver RX may receive the ultra-wideband pulses 201 as direct path or line-of-sight signals, and may measure the time of arrival in order to determine the time of flight of the signals and the range between the transmitter TX and the receiver RX.

However, in a multipath environment, not only the direct path signal 201 is present but also additional non line-of-sight or multipath signal components 202, especially reflecting off surfaces and scattering from objects. These multipath signals 202 may give rise to difficulty in the measurements of the direct path signal 201 and may degrade the reliability of the measurements as well as of the distance estimation.

FIG. 2B shows an multipath effect with noise conditions, especially the effect on the observed amplitude envelope at the receiver RX when a direct path signal 201 is followed by a multipath signal 202. The horizontal axis denotes the time axis for the signals and the vertical axis denotes the amplitude of the envelopes. As can be seen, the multipath signal 202 distorts the direct path signal 201 as the receiver RX may act on the resulting observed signal 203. Furthermore, for the observed signal 203, the increased measured energy may correspond to the associated noise that is particularly visible in the period 2-5 ns.

In this example, the multipath signal 202 follows the direct path signal 201 2 ns later and is 3 dB weaker, and is in-phase with the direct path signal 201. The observed trailing edge and also the peak of the resulting observed signal 203 are corrupted by the arrival of the effect of the following multipath signal 202. As such, the presence of multipath may considerably complicate the task of the receiver RX, because as a result of the duration of the pulses, it can occur that the direct path signal 201 overlaps with a later multipath signal 202.

As a consequence, the direct path signal 201 may suffer major disruption of its trailing edge, distortion and an offset of its peak, and some disturbance of the slope of its leading edge. Hence, in multipath conditions the performance is degraded, but to minimize the loss of accuracy the leading edge of the direct path signal 201 can be used as the basis for the estimation of time of arrival, especially to avoid the multipath effect on its peak and/or its trailing edge.

Furthermore, a direct path signal 201 with a sharper leading edge than the trailing edge may improve the accuracy of the measurement when using the leading edge, since the multipath components may have less effect on the direct path measurement until they are closer. Moreover, a precursor pulse, especially a negative precursor pulse can be introduced to the transmitted signal, which may allow the generation of a sharper rise time for the leading edge and may pre-correct for the smoothing effect of the receiver filter.

Figure 3:
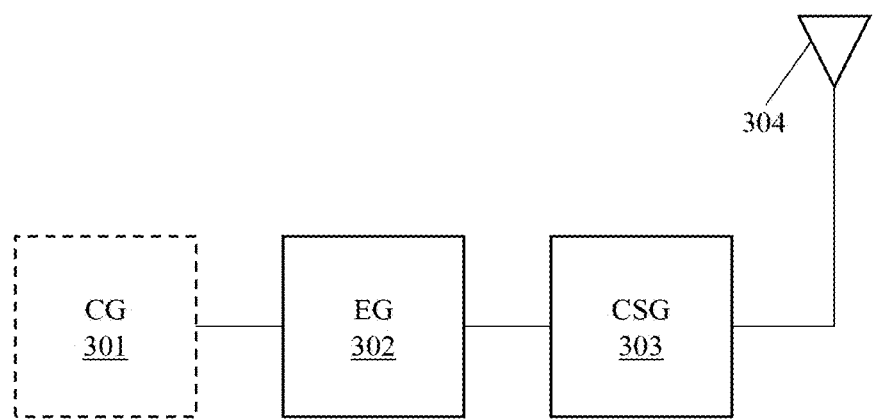
FIG. 3 shows an embodiment of the transmitter according to an example of the present disclosure.

In FIG. 3, an embodiment of the ultra-wideband transmitter 300 according to the second example of the present disclosure is illustrated. The transmitter 300 may comprise a code generator (CG) 301 that may generate amplitude and phase codes for transmitting pulses or bursts, e.g., by means of a 2-bit ternary code comprising amplitude and phase bits or codes.

The transmitter 300 may further comprise an envelope generator (EG) 302 that may receive the bits or codes from the code generator 301 and may generate, especially for the transmitting pulses or the bursts, an ultra-wideband pulse envelope comprising a main pulse and a precursor pulse. In this regard, the precursor pulse may be shorter in length and lower in amplitude compared to the main pulse.

The transmitter 300 may further comprise a carrier signal generator (CSG) 303 that may modulate a carrier signal in amplitude such that the envelope corresponds to the ultra-wideband pulse envelope and such that the carrier signal within the main pulse is phase-shifted with respect to the carrier signal within the precursor pulse.

The transmitter 300 may further comprise a transmit antenna 304 that may transmit the generated ultra-wideband signal, e.g., to a receiver (not shown). The transmit antenna 304 may be an ultra-wideband antenna, for example, a patch antenna, a dipole antenna, an exponential antenna, a log-periodic antenna, and the like.

Figure 4:
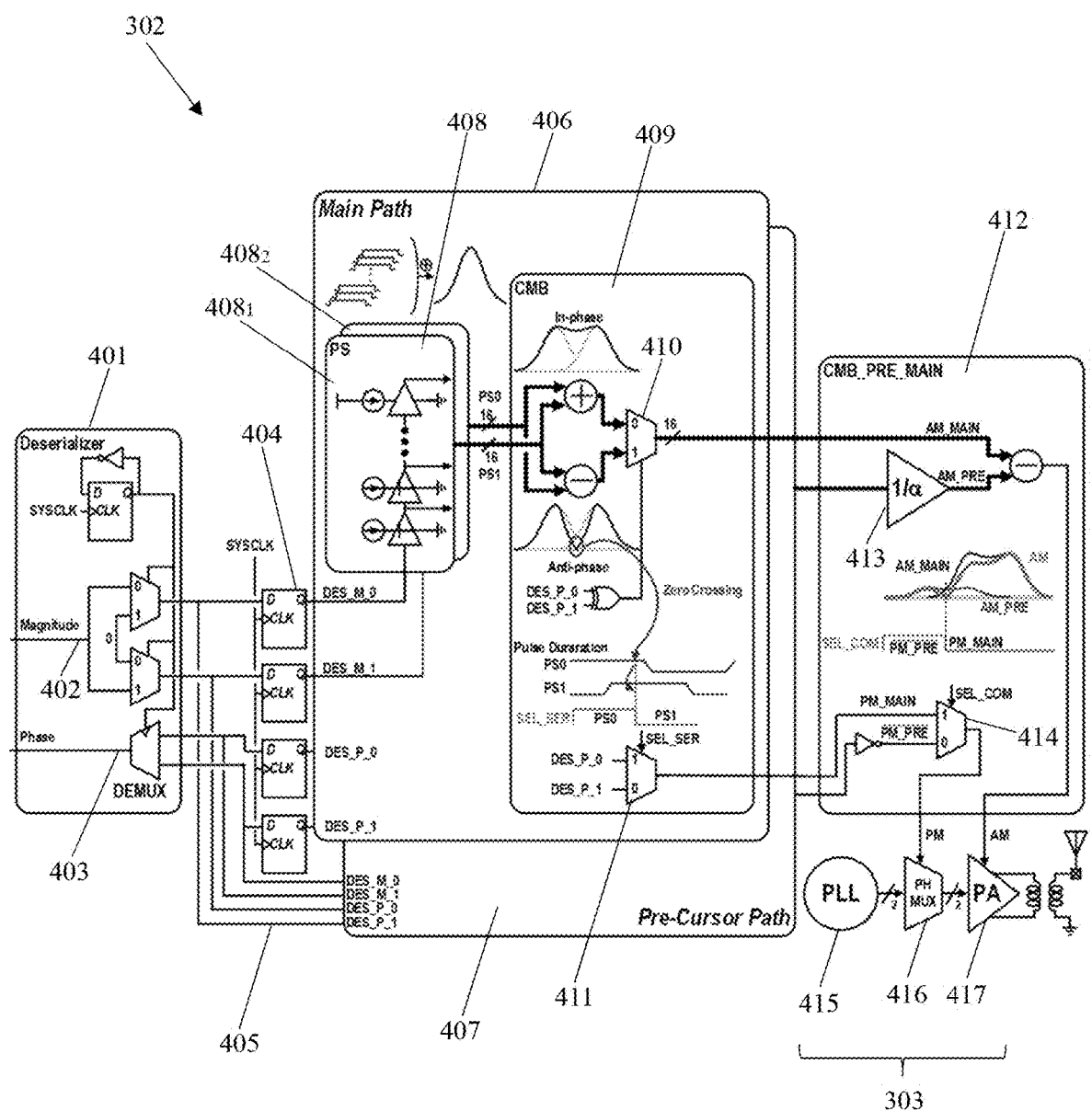
FIG. 4 shows the transmitter of FIG. 3 in detail.

In FIG. 4, the ultra-wideband transmitter 300 is illustrated in detail. The envelope generator 302 may comprise a de-serializer block 401 in order to de-serialize the input data stream or burst. For instance, a 2-bit ternary code with magnitude bits 402 and phase bits 403 may be de-serialized, where the magnitude bits 402 may undergo a multiplexing operation and the phase bits 403 may undergo a de-multiplexing operation, where an output of a data flip-flop driven by the system clock SYSCLK may drive the multiplexing and de-multiplexing operations.

The respective de-serialized magnitude and phase bits are exemplarily defined herein as DES_M_0, DES_M_1, and DES_P_0, DES_P_1, respectively. It is to be note that the de-serialization operation illustrated herein by way of an example and any de-serialization techniques known in the art to achieve the same result can be used. As an alternative embodiment, the code generator 301 may comprise the de-serializer block 401 and the envelope generator 302 may receive the de-serialized bits DES_M_0, DES_M_1, DES_P_0, and DES_P_1 therefrom.

The envelope generator 302 may further comprise a first path or main path 406 and a second path or precursor path 407, whereby the envelope generator 302 may generate the main pulse along the main path 406 and may generate the precursor pulse along the precursor path 407. In this regard, the main path 406 may comprise a group of data flip-flops 404, and a number of 4 data flip-flops in order to provide a delay of one chip period in the reception of the de-serialized bits DES_M_0, DES_M_1, DES_P_0, and DES_P_1 compared to the pre-cursor path 407.

As illustrated, the precursor path 407 may receive the de-serialized bits DES_M_0, DES_M_1, DES_P_0, and DES_P_1 through a direct path 405. In other words, the main path 406 is delayed by one chip period compared to the precursor path 407 in order to delay the main pulse by one chip period compared to the precursor pulse.

The main path 406 may comprise one or more pulse shaping units or pulse shapers 408, exemplarily two pulse shaping units corresponding to the magnitude bits, such as a first pulse shaper 4081 corresponding to the magnitude bit DES_M_0 and a second pulse shaper 4082 corresponding to the magnitude bit DES_M_1, and are time interleaved by one chip period due to the de-serialization.

The first pulse shaper 4081 and the second pulse shaper 4082 may comprise or be delay-based pulse shapers that may utilize delay elements to generate delayed pulses of the respective magnitude bits. The combination of delayed pulses may generate the digital pulse shapes of the respective magnitude bits. Herein, the output pulses of the first pulse shaper 4081 are exemplarily defined as PS0 and the output pulses of the second pulse shaper 4082 are exemplarily defined as PS1.

It is to be noted that the pulse shapers 408 may generate the pulse shapes corresponding to the magnitude bits as an asymmetrical pulse shape, such that the slope for the leading edge is steeper compared to the trailing edge.

The main path 406 may further comprise a first pulse combiner 409 that may combine the output pulses PS0 of the first pulse shaper 4081 and the output pulses PS1 of the second pulse shaper 4082, especially based on the respective phase bits DES_P_0 and DES_P_1. In other words, the first pulse combiner 409 may re-serialize the de-serialized and time interleaved bits by combining the pulse shaper outputs PS0 and PS1.

For instance, a first multiplexer 410 may select the output pulses PS0 and PS1 to be added or be subtracted based on the phase bits DES_P_0 and DES_P_1, e.g., if the phase bits DES_P_0 and DES_P_1 have equal polarity (in-phase), the output pulses PS0 and PS1 may be added and if the phase bits DES_P_0 and DES_P_1 have opposite polarity (anti-phase), the output pulses PS0 and PS1 may be subtracted. The output of the first multiplexer 410 may correspond to the amplitude information or envelope of the main pulse and is exemplarily defined herein as AM_MAIN.

The first pulse combiner 409 may additionally comprise a second multiplexer 411 that may select the phase bits DES_P_0 and DES_P_1 based on a zero-crossing instance obtained from the pulse subtraction. The output of the second multiplexer 411 may correspond to the phase information of the main pulse and is exemplarily defined herein as PM_MAIN.

Although not shown, the precursor path 407 may be realized in an analogous manner to the main path 406, thereby generating an output corresponding to the amplitude information or envelope of the precursor pulse (exemplarily defined as AM_PRE) and an output corresponding to the phase information of the precursor pulse (exemplarily defined as PM_PRE).

The envelope generator 302 may further comprise a second pulse combiner 412 that may combine the outputs AM_MAIN and AM_PRE in order to generate the amplitude information or envelope for the carrier signal modulation. In this regard, the second pulse combiner 412 may factorize the output AM_PRE in amplitude, e.g., via an amplifier 413 with a constant gain, with respect to the amplitude of the output AM_MAIN, and may subtract the outputs AM_MAIN and the factorized AM_PRE.

The second pulse combiner 412 may further comprise a third multiplexer 414 that may select the outputs PM_MAIN and PM_PRE based on a zero-crossing instance obtained from the pulse subtraction. The output of the third multiplexer 414 may be used as the phase information for the carrier signal modulation. In this regard, the output PM_PRE may be inverted prior to the selection by the third multiplexer 414 in order to phase shift, e.g., a phase shift of 180 degrees, the carrier signal within the main pulse with respect to the carrier signal within the precursor pulse.

The carrier signal generator 303 may comprise an oscillator (PLL) 415 that may generate a carrier signal to be modulated, a phase modulator or multiplexer 416, and an amplitude modulator or amplifier 417. The phase modulator 416 may use the phase information from the output of the third multiplexer 414 to modulate the phase of the carrier signal and the amplitude modulator 417 may use the amplitude information or envelope from the second combiner 412 to modulate the amplitude of the carrier signal, especially to generate the ultra-wideband transmit signal. The generated transmit signal may be transmitted by an ultra-wideband antenna, e.g., the ultra-wideband transmit antenna 304.

Figure 5:
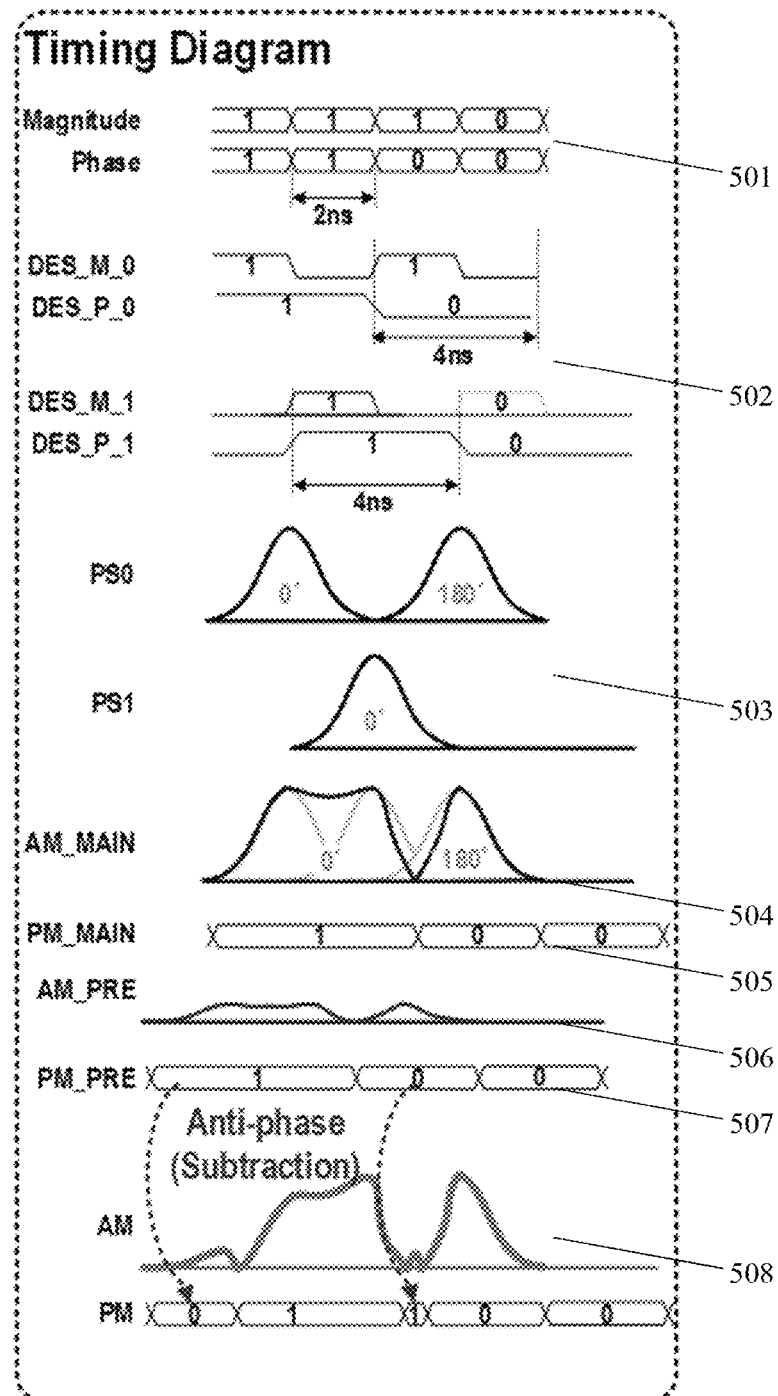
FIG. 5 shows an operation and timing diagram of the transmitter according to an example of the present disclosure.

In FIG. 5, an operation and timing diagram of the transmitter according to FIG. 4 is illustrated. In the segment 501, a 2-bit ternary code with magnitude and phase bits are shown. The 2-bit ternary code runs at 499.2 MHz, i.e., having a chip period of 2 ns. The magnitude bits are shown as a stream of 1110 and the respective phase bits are shown as a stream of 1100.

In the next segment 502, the de-serialized bits DES_M_0, DES_P_0, DES_M_1, and DES_P_1 are shown. It can be seen that the 2-bit ternary code is de-serialized into two parallel paths that run at 248.6 MHz, i.e., having a period of 4 ns. Here, the magnitude bit DES_M_0 comprises the first and the third bits of the magnitude stream and the magnitude bit DES_M_1 comprises the second and the fourth bits of the magnitude stream. The phase bits DES_P_0 and DES_P_1 comprises the phase bits of the phase stream corresponding to the respective amplitude bits DES_M_0 and DES_M_1, respectively.

In the next segment 503, the outputs PS0 and PS1 of the pulse shapers 4081 and 4082, respectively, are shown. In the following segment 504, the output AM_MAIN from the first multiplexer 410 is shown. It can be seen that the pulses with same phase are added and the pulses with opposite phase are subtracted. Based on the zero-crossing detected in the subtraction, the selection of the phase bits DES_P_0 and DES_P_1, i.e., the output PM_MAIN from the second multiplexer 411 are shown in the segment 505.

The example pulse combination eliminates ISI while generating and transmitting the consecutive pulses since the time-interleaved pulses are combined by taking into account the correct phase of the pulses. The consecutive pulses with same phase (in-phase pulses) are combined (e.g. merged) and a phase jump is provided between pulses with opposite phase (anti-phase pulses), as can be seen in the segment 504.

The next segments 506 and 507 show the outputs AM_PRE and PM_PRE, respectively, from the precursor path 407, which are analogously generated, e.g., via analogous components corresponding to the main path 406. However, it can be seen that the outputs AM_PRE and PM_PRE are one chip period ahead of the outputs AM_MAIN and PM_MAIN, respectively, due to the delay 404 implemented in the main path 406.

Finally, in the segment 508, the amplitude information or envelope AM and the phase information PM are shown that can be used for carrier signal modulation. Especially, the AM information is generated by subtracting the AM_MAIN and AM_PRE and the PM information shows the anti-phase relation between the precursor and the main pulse.

As such, the carrier signal can be modulated in amplitude, especially to generate the transmit signal, to comprise a precursor pulse and a main pulse, where the precursor pulse is one chip period ahead of the main pulse. Furthermore, the carrier signal can be modulated in phase so that the carrier signal within the main pulse can be phase shifted, e.g., anti-phase, with respect to the carrier signal within the precursor pulse.

Figure 6:
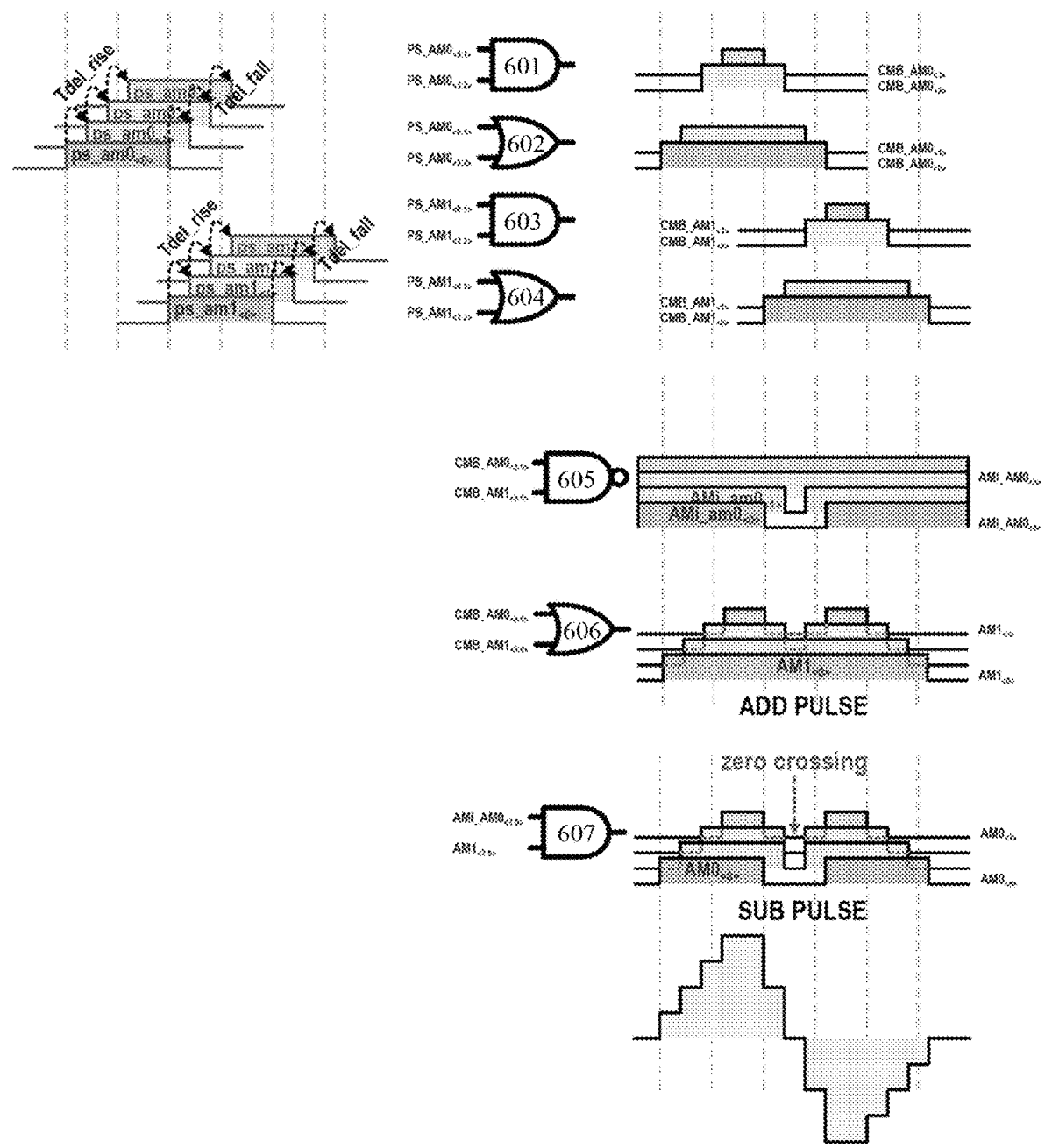
FIG. 6 shows a pulse combination operation according to an example of the present disclosure.

In FIG. 6, an pulse combination and zero-crossing detection scheme is illustrated, for example, for the main path 406 and the precursor path 407. For instance, each of the first pulse shaper 4081 and the second pulse shaper 4082 may comprise a four-stage delay-based pulse shaper. The delayed pulses PS_AM0<0-3> may correspond to the magnitude bit DES_M_0 generated by the first pulse shaper 4081 and the delayed pulses PS_AM1<0-3> may correspond to the magnitude bit DES_M_1 generated by the second pulse shaper 4082. The pulses PS_AM1<0-3> is delayed by one chip period with respect to the pulses PS_AM0<0-3> due to the de-serialization.

In order to shape the pulses, a number of logic operations may be implemented. For example, in the first pulse shaper 4081, a first AND operation 601 may be performed on the pulses PS_AM0<0> and PS_AM0<3> and further on the pulses PS_AM0<1> and PS_AM0<2> in order to generate the pulses CMB_AM0<3> and CMB_AM0<2>. At the same time, a first OR operation 602 may be performed on the pulses PS_AM0<0> and PS_AM0<3> and further on the pulses PS_AM0<1> and PS_AM0<2> in order to generate the pulses CMB_AM0<1> and CMB_AM0<0>.

In an analogous manner, in the second pulse shaper 4082, a second AND operation 603 may be performed on the pulses PS_AM1<0> and PS_AM1<3> and further on the pulses PS_AM1<1> and PS_AM1<2> in order to generate the pulses CMB_AM1<3> and CMB_AM1<2>. At the same time, a second OR operation 604 may be performed on the pulses PS_AM1<0> and PS_AM1<3> and further on the pulses PS_AM1<1> and PS_AM1<2> in order to generate the pulses CMB_AM1<1> and CMB_AM1<0>.

In order to re-serialize the bits, the first combiner 409 may implement a further logic operations in order to combine the pulses according to the phase bits. For instance, a NAND operation 605 may be performed on the pulses CMB_AM0<0-3> and CMB_AM1<0-3> to generate the pulses AMi_AM0<0-3>. To add the pulses, e.g., for in-phase pulses, a further AND operation 606 may be performed on the pulses CMB_AM0<0-3> and CMB_AM1<0-3> to generate the pulses AM1<0-3>. Furthermore, to subtract the pulses, e.g., for anti-phase pulses, a further OR operation 607 may be performed on the pulses Ami_AM0<0-3> and AM1<0-3> to generate the pulses AM0<0-3>.

The above-mentioned pulse combination operation may provide the zero-crossing instance, which can be used to select the appropriate phase bits DES_P_0 and DES_P_1 for phase modulation of the carrier signal.

Figure 7:
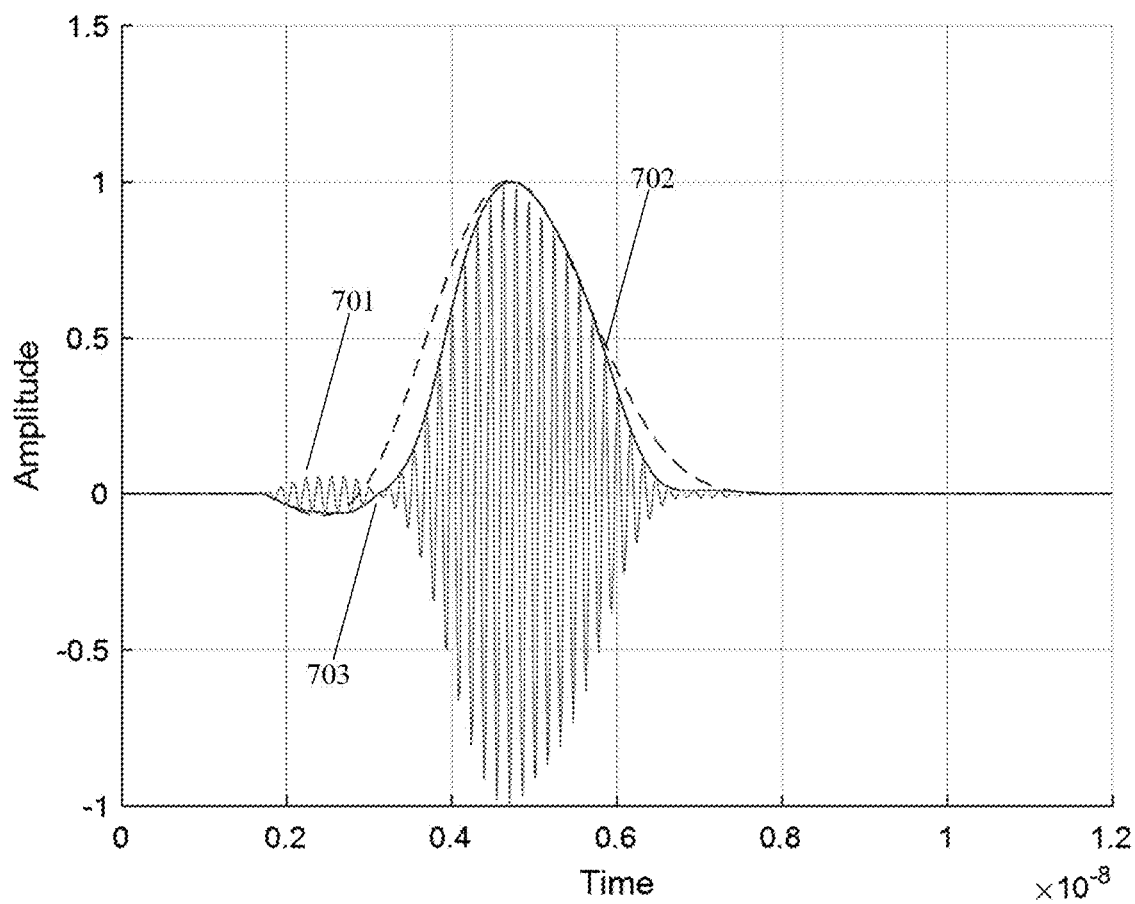
FIG. 7 shows an ultra-wideband signal according to an example of the present disclosure.

In FIG. 7, an ultra-wideband signal or pulse 700 is illustrated. The horizontal axis denotes the time axis and the vertical axis denotes the amplitude of the envelope. The ultra-wideband signal 700 may correspond to the transmit signal generated and to be transmitted by the ultra-wideband transmitter 300. It can be seen that the ultra-wideband signal 700 comprises a precursor pulse 701 followed by a main pulse 702, whereby the precursor pulse 701 has an amplitude of about 10% with respect to the peak amplitude of the main pulse 702.

It can further be seen that the carrier signal within the main pulse 702 is anti-phase of the carrier signal within the precursor pulse 701, and the phase reversal or phase jump can be seen at the position 703. It can also be seen that the main pulse has a steeper slope for the leading edge compared to the trailing edge.

In addition, the trailing edge of the pulse 700, especially the trailing edge of the main pulse 702, can be shaped accordingly in order to maintain compliance with spectrum requirements. In other words, especially to meet the spectrum mask requirements and also to achieve a steeper leading edge, compromises can be made on the trailing edge, particularly on the shape of the trailing edge.

Figure 8:
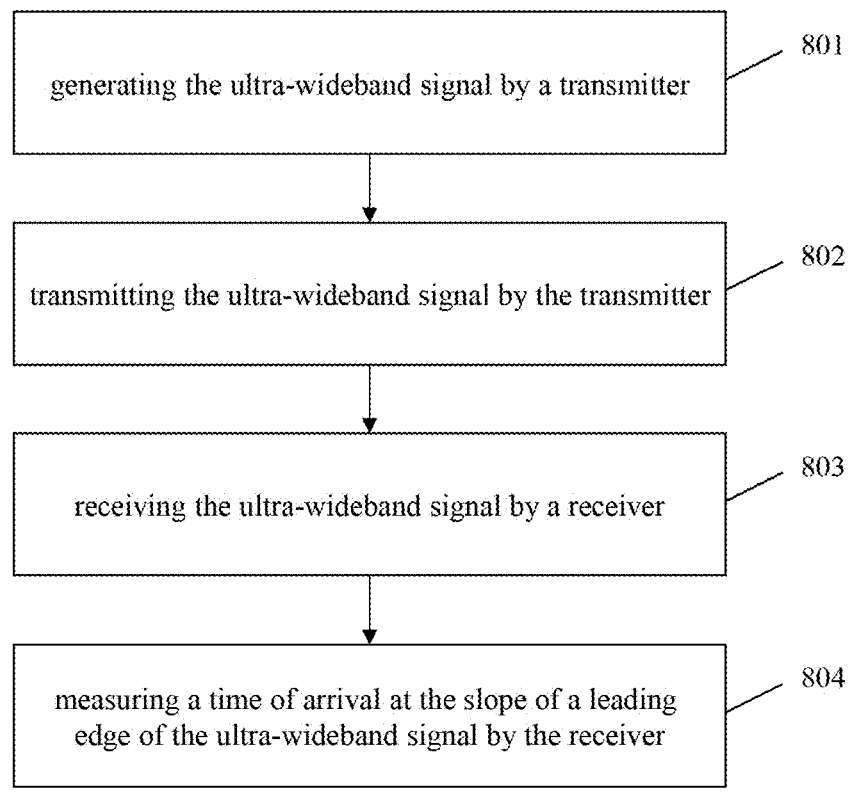
FIG. 8 shows an embodiment of the ranging and/or sensing method according to an example of the present disclosure.

In FIG. 8, an embodiment of the method 800 according to the third example of the present disclosure is illustrated. In a first step 801, an ultra-wideband signal according to the method 100 is generated by a transmitter. In a second step 802, the ultra-wideband signal is transmitted by the transmitter. In a third step 803, the ultra-wideband signal is received by a receiver. In a fourth step 804, a time of arrival is measured by the receiver at the slope of a leading edge of at least one direct path and/or multipath component of the ultra-wideband signal.

Figure 9:
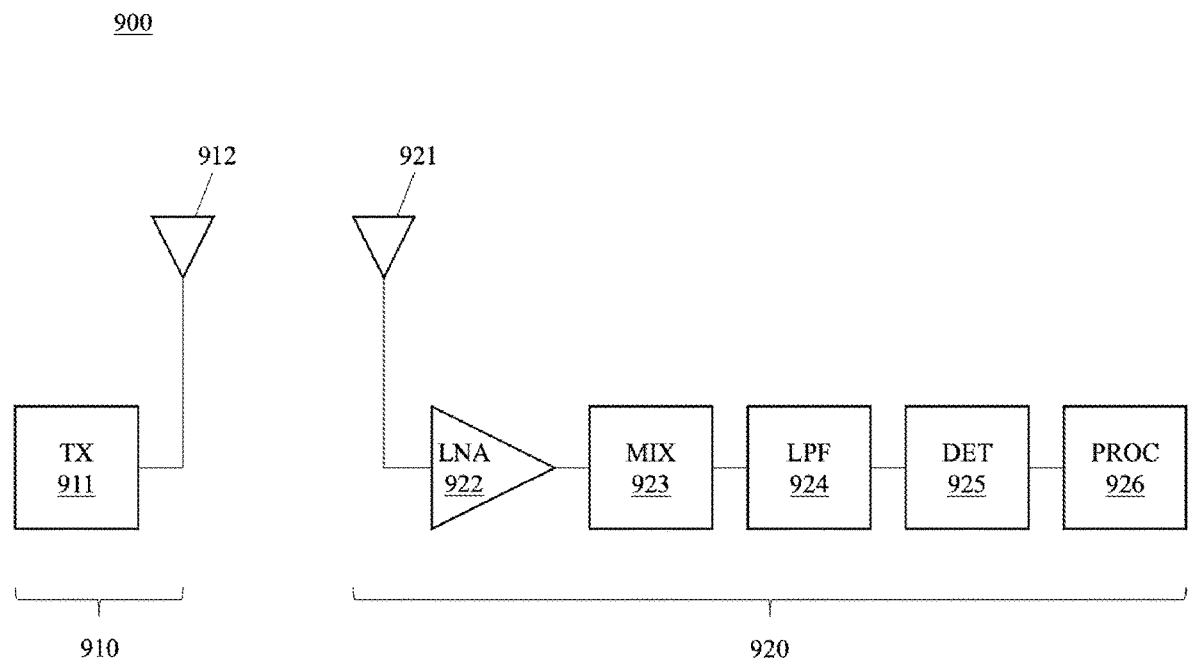
FIG. 9 shows an embodiment of the ranging and/or sensing system according to an example of the present disclosure.

In FIG. 9, an embodiment of the ultra-wideband ranging and/or sensing system 900 according to the fourth of the present disclosure is illustrated. The system 900 may comprise a transmitter 910 and a receiver 920. The transmitter 910 may comprise a transmitter block 911 and a transmit antenna 912. The transmitter 910 may correspond to the ultra-wideband transmitter 300 of FIG. 3. For example, the transmitter block 911 may comprise the code generator 301, the envelope generator 302, and the carrier signal generator 303. The transmit antenna 912 may correspond to the transmit antenna 304.

The receiver 920 may comprise a receiver antenna 921 followed by an amplifier 922, especially a low-noise amplifier (LNA), followed by a mixer 923 followed by a low-pass filter 924, especially a matching low-pass filter with respect to the envelope of the transmit signal, followed by a detector 925 followed by a processor 926. The detector 925 may be implemented as a stand-alone unit or may be incorporated within and/or implemented by the processor 926.

Generally, the transmitter 910 may generate the ultra-wideband signal 700 of FIG. 7 and may transmit the ultra-wideband signal towards the receiver 920. The receiver 920 may receive the ultra-wideband signal and may measure a time of arrival at the slope of a leading edge of at least one direct path and/or multipath component of the ultra-wideband signal, especially at the slope of a leading edge of the main pulse 702 of the ultra-wideband signal.

In this regard, especially for the direct path component of the ultra-wideband signal, the amplifier 922 may amplify the received signal without significantly degrading the signal-to-noise property of the signal, especially by minimizing the amplifier induced noise. The mixer 923 may perform baseband conversion on the received signal at the output of the amplifier 922. The low-pass filter 924 may perform filtering after the baseband conversion to extract the received signal at baseband. Hereinafter, the filtered signal is referred as the observed pulse.

The detector 925 along with the processor 926 may perform a time of arrival measurement at the slope of the leading edge of the observed pulse. However, in practice, the low-pass filter 924 in the receiver may have the effect of lengthening the pulse shape, smoothing the leading edge, and generating some ripple in the trailing edge. In order to improve the accuracy of the time of arrival measurement when using the leading edge of the observed pulse, it is important to have a leading edge for the amplitude envelope of the observed pulse, which is steeper than its trailing edge.

It is to be noted that the transmitter 910 and the receiver 920 may be arranged in a distributed manner within the system 900 to facilitate a bi-static or multi-static configuration. Alternatively, the transmitter 910 and the receiver 920 may be collocated, especially by forming a transceiver unit comprising the transmitter 910 and the receiver 920, to facilitate a monostatic configuration.

Furthermore, in addition to the direct path signal component, the receiver 920 may measure the time of arrival for one or more multipath components of the ultra-wideband signal, such as in the bi-static or multi-static configuration, and in an analogous manner to the direct path signal component. Alternatively, the receiver 920 may measure the time of arrival for one or more multipath components, preferably in an analogous manner to the direct path signal component, to determine the round trip time of the propagation of the multipath components of the ultra-wideband signal, especially in the monostatic configuration.

Additionally, the transmitter 910 may transmit information regarding the magnitude or amplitude of the precursor pulse to the receiver 920. Additionally or alternatively, the transmitter 910 may transmit information regarding the phase of the precursor pulse to the receiver 920. In this regard, the receiver 920 may reconfigure the reception of the ultra-wideband signal accordingly, for example, by configuring the low-pass filter 924 based on the received information to complement the transmitter 910.

Additionally or alternatively, the receiver 920 may transmit information regarding the magnitude or amplitude of the precursor pulse to the transmitter 910. Additionally or alternatively, the receiver 920 may transmit information regarding the phase of the precursor pulse to the transmitter 910. In this regard, the transmitter 910 may generate the precursor pulse based on the received information.

Figure 10:
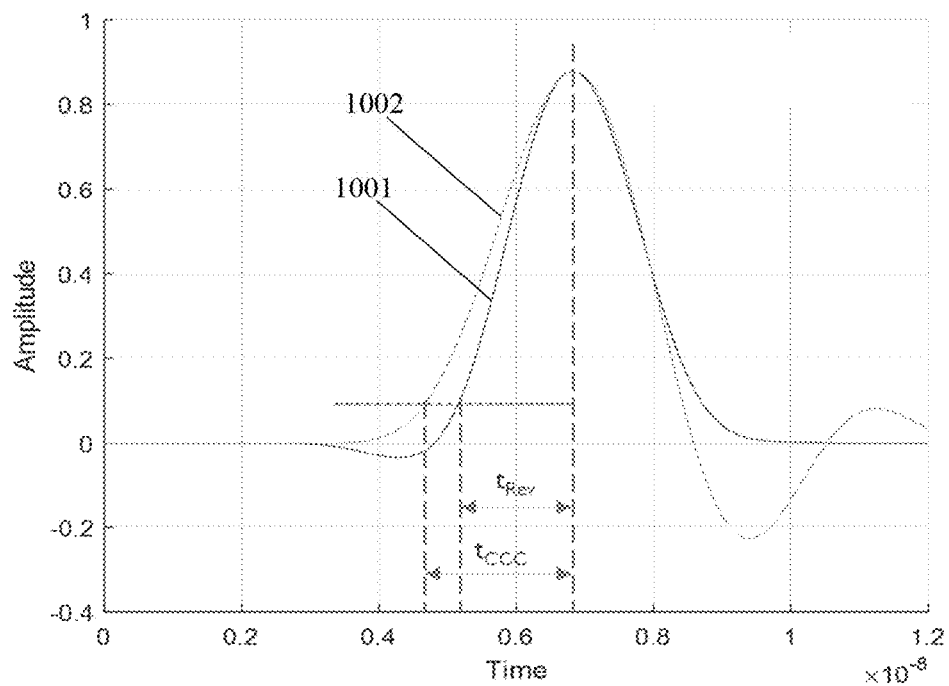
FIG. 10 shows a comparison between received pulses with different slope of the leading edge.

In FIG. 10, an comparison between pulses observed by a receiver, e.g., after passing through the receiver filter, with different slope of the leading edge is illustrated. The observed pulse 1001 may correspond to the ultra-wideband signal 700 with the precursor pulse 701 and the main pulse 702. The observed pulse 1002 may correspond to a waveform (CCC 0x2) defined by the Connected Car Consortium (CCC). The horizontal axis denotes the time axis and the vertical axis denotes the amplitude of the envelope. The term $t_{Rev}$ denotes the rise time of the observed pulse 1001 and the term $t_{CCC}$ denotes the rise time of the observed pulse 1002.

It can be seen that, even after the smoothing effect of the low-pass filter, e.g., the low-pass filter 924, the observed pulse 1001 has a shorter rise time, i.e., a steeper leading edge, compared to the observed pulse 1002. This is because the negative precursor pulse provides a downwards energy to the main pulse, thereby resulting the leading edge of the main pulse steeper as the leading edge is already rising at the zero crossing, whereby the preceding energy is reduced by the filtering.

In particular, due to the difference in phase relationship between the main pulse and the precursor pulse, especially due to the difference in phase relationship of the carrier signal corresponding to the main pulse and the precursor pulse, the precursor pulse comprises a different, particularly a negative phase in relation to the main pulse. As such, the signal energy for the precursor pulse is out of phase with that of the main pulse, which destructively interferes with the beginning of the main pulse, e.g., in the low-pass filter 924, thereby resulting in the steeper rise time of the main pulse.

Figure 11:
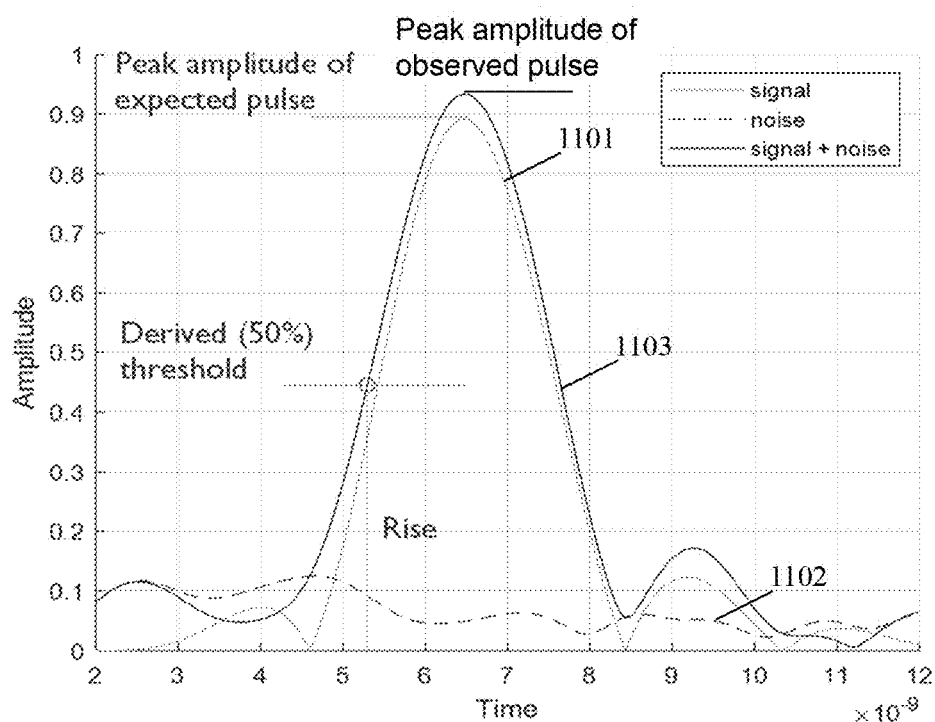
FIG. 11 shows a time of arrival measurement according to an example of the present disclosure.

In FIG. 11, an time of arrival measurement scheme is illustrated. The signal 1101 corresponds to the expected pulse at the receiver, the signal 1102 corresponds to the noise, and the signal 1103 corresponds to the observed pulse, i.e., the combination of the expected pulse 1101 and noise 1102. The horizontal axis denotes the time axis and the vertical axis denotes the amplitude of the envelope.

The processor 926, especially by means of the detector 925, may execute algorithms for the estimation of the time of arrival of the received signal, especially in the presence of noise and multipath. Because of the disturbance of the peak and of the trailing edge, the processor 926 may perform the time of arrival measurement based on measurement of the leading edge of the waveform, as this is less affected by any following multipath components.

The processor 926 may execute a basic algorithm to perform the time of arrival measurement where the amplitude of the received pulse envelope, i.e. the expected pulse 1101, is pre-estimated or known. In essence, the basic algorithm:

may assume the signal level of the expected pulse 1101, may set a threshold at a given percentage of the expected pulse amplitude, may find the time at which the leading edge crosses the threshold, and may infer the timing of the peak of the expected pulse 1101 from the nominal shape of the pulse.

For example, the threshold may be set at 50% of the peak amplitude, since the rate of change of amplitude is fastest at this level, and the signal to noise ratio is reasonable. The timing of the peak may be offset from the threshold-crossing by the elapsed time from the threshold-crossing to the peak for a received and filtered pulse with the nominal amplitude.

Additionally or alternatively, the processor 926 may execute an advanced algorithm to perform the time of arrival measurement where the amplitude of the received pulse envelope, i.e. the expected pulse 1101, is unknown, and therefore is needed to be estimated. The advanced algorithm:

may measure or estimate the maximum signal peak in the expected timing range for the observed pulse 1103, may set a threshold at a given percentage, e.g., at 50%, of the observed peak, may find the time at which the leading edge crosses the threshold, and may infer the timing of the peak from the expected shape of the pulse.

Figure 12:
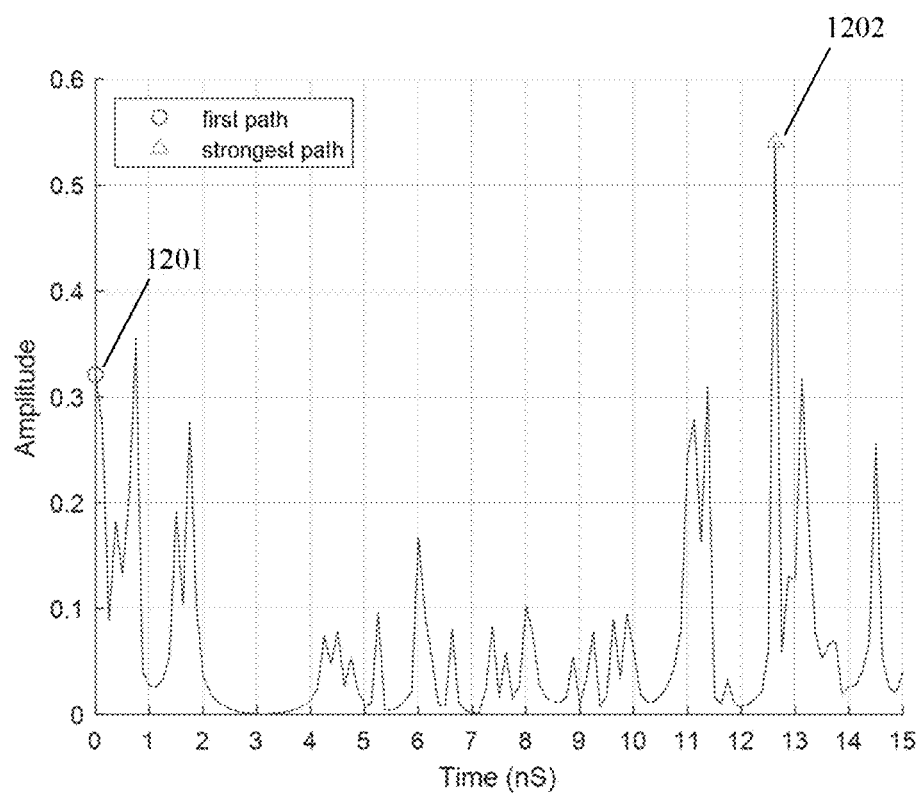
FIG. 12 shows a non line-of-sight observation.

In FIG. 12, a non line-of-sight observation is illustrated. In particular, FIG. 12 shows a scenario that may depict the Sarah-Valenzuela model for the propagation of signal multipath components, which may arrive in clusters, each with a Poisson distribution for ray arrival times.

The scenario may correspond to an office environment where some of the rooms may be comparable in size to residential, but other rooms (especially Cubicle areas, laboratories, etc.) may be considerably larger. Furthermore, areas with many small offices may be typically linked by long corridors. Each of the offices may contain furniture, bookshelves on the walls, etc., which may add to the attenuation given by the office partitioning.

It can be seen that the first path 1201 at 0 ns is closely followed by multipath components, and then sometime later around 12.6 ns, there is a strong path 1202, also followed closely by multipath components. The system 900, especially the receiver 920, may therefore measure the time of arrival of the first path of each cluster. It can also be seen that the closely following multipath components may affect the trailing edge of the strong paths 1201, 1202, and therefore the measurement at the leading edge to estimate the time of arrival may be beneficial.

Therefore, the present disclosure discloses the generation of an ultra-wideband pulse having a negative precursor pulse and a main pulse, where the ultra-wideband pulse, especially the main pulse, may have a sharper leading edge than its trailing edge. The trailing edge, especially the fall time of the amplitude envelope, may be comparatively relaxed in order to satisfy the spectrum requirements.

For ranging applications, the receiver may receive the ultra-wideband pulse and may measure the time of arrival using the leading edge of the amplitude envelope, especially for the direct path signal component. For sensing applications, the receiver may receive the ultra-wideband pulse and may measure the time of arrival using the leading edge of the amplitude envelope, especially for one or more multipath components. Additionally, the measurement of multipath components may also be used for ranging applications. The sharper rise in the leading edge amplitude envelope may produce a smaller error than for the case of a conventional recommended shape of waveform meeting the spectrum requirements.

The present disclosure further discloses a pulse combination technique, especially to generate the ultra-wideband pulse for a transmit data stream, based on a deserialization-serialization combination to reduce the ISI between consecutive pulses.

It is important to note that, in the claims as well as in the description, the word "comprising" does not exclude other elements or steps and the indefinite article "a" or "an" does not exclude a plurality. A single element or other unit may fulfill the functions of several entities or items recited in the claims. Moreover, the description with regard to any of the examples is also relevant with regard to the other examples of the present disclosure.

Although the present disclosure has been illustrated and described with respect to one or more implementations, equivalent alterations and modifications will occur to others skilled in the art upon the reading and understanding of this specification and the annexed drawings. In addition, while a particular feature of the present disclosure may have been disclosed with respect to only one of several implementations, such feature may be combined with one or more other features of the other implementations as may be desired and advantageous for any given or particular application.

What is claimed is:

1. A method for generating an ultra-wideband signal comprising:

generating at least one ultra-wideband pulse envelope comprising a main pulse and a precursor pulse, the precursor pulse being shorter in length and lower in amplitude compared to the main pulse, and modulating a carrier signal in amplitude such that the envelope corresponds to the at least one ultra-wideband pulse envelope and such that the carrier signal within the main pulse is phase-shifted with respect to the carrier signal within the precursor pulse.

2. The method of claim 1, wherein the method further comprises phase-shifting the carrier signal within the main pulse by 180° with respect to the carrier signal within the precursor pulse.

3. The method of claim 1, wherein the main pulse is an asymmetrical pulse, preferably comprising a steeper slope for a leading edge of the main pulse compared to a trailing edge of the main pulse.

4. The method of claim 3, wherein the method further comprises phase-shifting the carrier signal within the main pulse by a range of from 90° to 270° with respect to the carrier signal within the precursor pulse.

5. An ultra-wideband ranging and/or sensing system comprising:

a transmitter according to claim 4, the transmitter being configured to generate the ultra-wideband signal and further to transmit the ultra-wideband signal, and a receiver configured to receive the ultra-wideband signal and further to measure a time of arrival at the slope of a leading edge of at least one direct path and/or multipath component of the ultra-wideband signal.

6. The system according to claim 5, wherein the transmitter is configured to provide magnitude and/or phase information of the precursor pulse to the receiver, and/or wherein the receiver is configured to provide magnitude and/or phase information of the precursor pulse to the transmitter, and the transmitter is further configured to generate the precursor pulse based on the received magnitude and/or phase information.

7. An ultra-wideband transmitter comprising:
an envelope generator, and
a carrier signal generator,
wherein the envelope generator is configured to generate at least one ultra-wideband pulse envelope comprising a main pulse and a precursor pulse, the precursor pulse being shorter in length and lower in amplitude compared to the main pulse, and
wherein the carrier signal generator is configured to modulate a carrier signal in amplitude such that the envelope corresponds to the at least one ultra-wideband pulse envelope and such that the carrier signal within the main pulse is phase-shifted with respect to the carrier signal within the precursor pulse.

8. The ultra-wideband transmitter of claim 7,
wherein the envelope generator comprises a first pulse generation path, a second pulse generation path, and a pulse combiner, the envelope generator being configured to generate a main pulse envelope along the first pulse generation path and a precursor pulse envelope along the second pulse generation path, and
wherein the pulse combiner is configured to combine the main pulse envelope and the precursor pulse envelope, thereby generating the at least one ultra-wideband pulse envelope.

9. The ultra-wideband transmitter according to claim 8,
wherein the first pulse generation path comprises a delay element configured to provide a predefined time-delay, preferably a delay of one chip period.

10. The ultra-wideband transmitter of claim 8,
wherein the pulse combiner is further configured to factorize an amplitude and a length of the precursor pulse envelope with respect to an amplitude and a length of the main pulse envelope, especially prior to the combination.

11. The ultra-wideband transmitter of claim 10,
wherein each of the first pulse generation path and the second pulse generation path comprises a pulse shaping unit configured to generate a pulse envelope having an asymmetrical pulse shape, preferably comprising a steeper slope for a leading edge compared to a trailing edge of the pulse envelope.

12. The ultra-wideband transmitter of claim 10,
wherein the first pulse generation path comprises a delay element configured to provide a predefined time-delay, preferably a delay of one chip period.

13. The ultra-wideband transmitter of claim 12,
wherein each of the first pulse generation path and the second pulse generation path comprises a pulse shaping unit configured to generate a pulse envelope having an asymmetrical pulse shape, preferably comprising a steeper slope for a leading edge compared to a trailing edge of the pulse envelope.

14. The ultra-wideband transmitter of 13,
wherein the envelope generator is configured to receive unit pulses corresponding to a predefined amplitude code and a predefined phase code, and
wherein the pulse shaping unit comprises a first pulse shaping path and a second pulse shaping path, the first pulse shaping path and the second pulse shaping path being time-interleaved, preferably time-interleaved by one chip period, with respect to the unit pulses corresponding to the amplitude code, thereby generating time-interleaved pulse envelopes of the unit pulses corresponding to the amplitude code.

15. The ultra-wideband transmitter of claim 14,
wherein the pulse shaping unit comprises a further pulse combiner configured to combine the time-interleaved pulse envelopes of the unit pulses based on the unit pulses corresponding to the phase code.

16. The ultra-wideband transmitter of claim 15,
wherein the carrier signal generator is further configured to phase-shift the carrier signal within the main pulse by a range of from 90° to 270° with respect to the carrier signal within the precursor pulse.

17. The ultra-wideband transmitter of claim 15, wherein the carrier signal generator is further configured to phase-shift the carrier signal within the main pulse by a range of from 150° to 210° with respect to the carrier signal within the precursor pulse.

18. The ultra-wideband transmitter of claim 15, wherein the carrier signal generator is further configured to phase-shift the carrier by 180° with respect to the carrier signal within the precursor pulse.

19. An ultra-wideband ranging and/or sensing method comprising:
generating, by a transmitter, the ultra-wideband signal according to any one of claim 1,
transmitting the ultra-wideband signal by the transmitter,
receiving the ultra-wideband signal by a receiver, and
measuring a time of arrival at the slope of a leading edge of at least one direct path and/or multipath component of the ultra-wideband signal by the receiver.

20. The method of claim 19,
wherein the method further comprises providing, by the transmitter, magnitude and/or phase information of the precursor pulse to the receiver, and/or
wherein the method further comprises providing, by the receiver, magnitude and/or phase information of the precursor pulse to the transmitter, and generating the precursor pulse based on the received magnitude and/or phase information by the transmitter.

* * * * *